(12) United States Patent
Chen

(10) Patent No.: US 10,516,069 B2
(45) Date of Patent: Dec. 24, 2019

(54) ABSORBER SURFACE MODIFICATION

(71) Applicant: TSMC Solar Ltd., Taichung (TW)

(72) Inventor: Shih-Wei Chen, Kaohsiung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/517,961

(22) Filed: Oct. 20, 2014

(65) Prior Publication Data

US 2016/0111566 A1    Apr. 21, 2016

(51) Int. Cl.
| H01L 31/032 | (2006.01) |
| B05C 3/02 | (2006.01) |
| B05C 11/10 | (2006.01) |
| H01L 31/18 | (2006.01) |
| H01L 31/0749 | (2012.01) |
| H01L 31/0224 | (2006.01) |
| H01L 31/20 | (2006.01) |

(52) U.S. Cl.
CPC ............ *H01L 31/0322* (2013.01); *B05C 3/02* (2013.01); *B05C 11/10* (2013.01); *H01L 31/022441* (2013.01); *H01L 31/0749* (2013.01); *H01L 31/18* (2013.01); *H01L 31/1864* (2013.01); *H01L 31/206* (2013.01)

(58) Field of Classification Search
CPC . H01L 31/0322; H01L 31/206; H01L 31/208; H01L 31/18; H01L 31/1864; H01L 21/02282; H01L 31/0749; H01L 31/022441; B05C 11/10
See application file for complete search history.

(56) References Cited

U.S. PATENT DOCUMENTS

| 4,313,970 A | * | 2/1982 | Jones | ..................... B05B 12/24 427/557 |
| 6,268,014 B1 | * | 7/2001 | Eberspacher | ..... H01L 21/02568 257/E31.027 |
| 7,838,403 B1 | * | 11/2010 | Liu | ..................... C23C 18/1204 438/584 |

(Continued)

FOREIGN PATENT DOCUMENTS

| CN | 103066154 A | 4/2013 |
| CN | 103296130 A | 9/2013 |

(Continued)

OTHER PUBLICATIONS

Official Action dated Aug. 22, 2016 in counterpart Taiwan patent application.

*Primary Examiner* — Tuan A Hoang

(74) *Attorney, Agent, or Firm* — Duane Morris LLP

(57) ABSTRACT

The present disclosure provides systems and methods for depositing an alkaline metal layer on an absorber to generate a copper-poor region at a surface of the absorber. The copper-poor region provides an increased efficiency over non-treated absorbers having copper-rich surfaces. The alkaline metal layer may be deposited by any suitable deposition method, such as, for example, a wet deposition method. After the alkaline metal layer is deposited, the absorber is annealed, causing the alkaline metal layer to interact with the absorber to reduce the copper-profile of the absorber at the interface between the alkaline metal layer and the absorber.

14 Claims, 8 Drawing Sheets

(56) References Cited

U.S. PATENT DOCUMENTS

| | | | |
|---|---|---|---|
| 2008/0169025 A1* | 7/2008 | Basol | H01L 31/0322 136/262 |
| 2010/0148310 A1* | 6/2010 | Koo | H01L 21/3225 257/617 |
| 2010/0195096 A1* | 8/2010 | Schlezinger | G01N 21/894 356/237.5 |
| 2012/0285375 A1* | 11/2012 | Schaeffer | H01L 21/6715 118/69 |
| 2013/0109131 A1* | 5/2013 | Liang | H01L 31/18 438/95 |
| 2013/0224903 A1* | 8/2013 | Albin | H01L 31/18 438/95 |
| 2013/0292800 A1* | 11/2013 | Cao | H01L 21/02568 257/613 |
| 2015/0258553 A1* | 9/2015 | Kobayashi | H01L 21/67028 427/372.2 |

FOREIGN PATENT DOCUMENTS

| | | | |
|---|---|---|---|
| CN | 103474505 A | * 12/2013 | |
| CN | 103474505 A | * 12/2013 | |
| CN | 20121189541 | * 12/2013 | H01L 31/18 |

* cited by examiner

ABSORBER SURFACE MODIFICATION

BACKGROUND

This disclosure relates to thin film photovoltaic solar cells.

In a copper/gallium/selenium ("CIGS") thin film solar cells, the thin film stack generally comprises a substrate, a molybdenum ("Mo") thin film layer as a back contact layer (a.k.a., back electrode), and a CIGS thin film layer as the absorber layer. The structure can further include a buffer layer of CdS, for example. A top electrode layer (a.k.a., front contact or transparent conductive oxide layer) is provided above the buffer layer. Such structure is formed by first depositing the molybdenum thin film layer over the substrate. The CIGS thin film absorbed layer is formed by deposition of a Cu/In/Ga (CIG) intermetallic precursor layer on the Mo thin film layer and followed by selenization and optionally sulfurization of the CIG precursor in a furnace, thus, converting the CIG precursor layer into the final CIGS layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
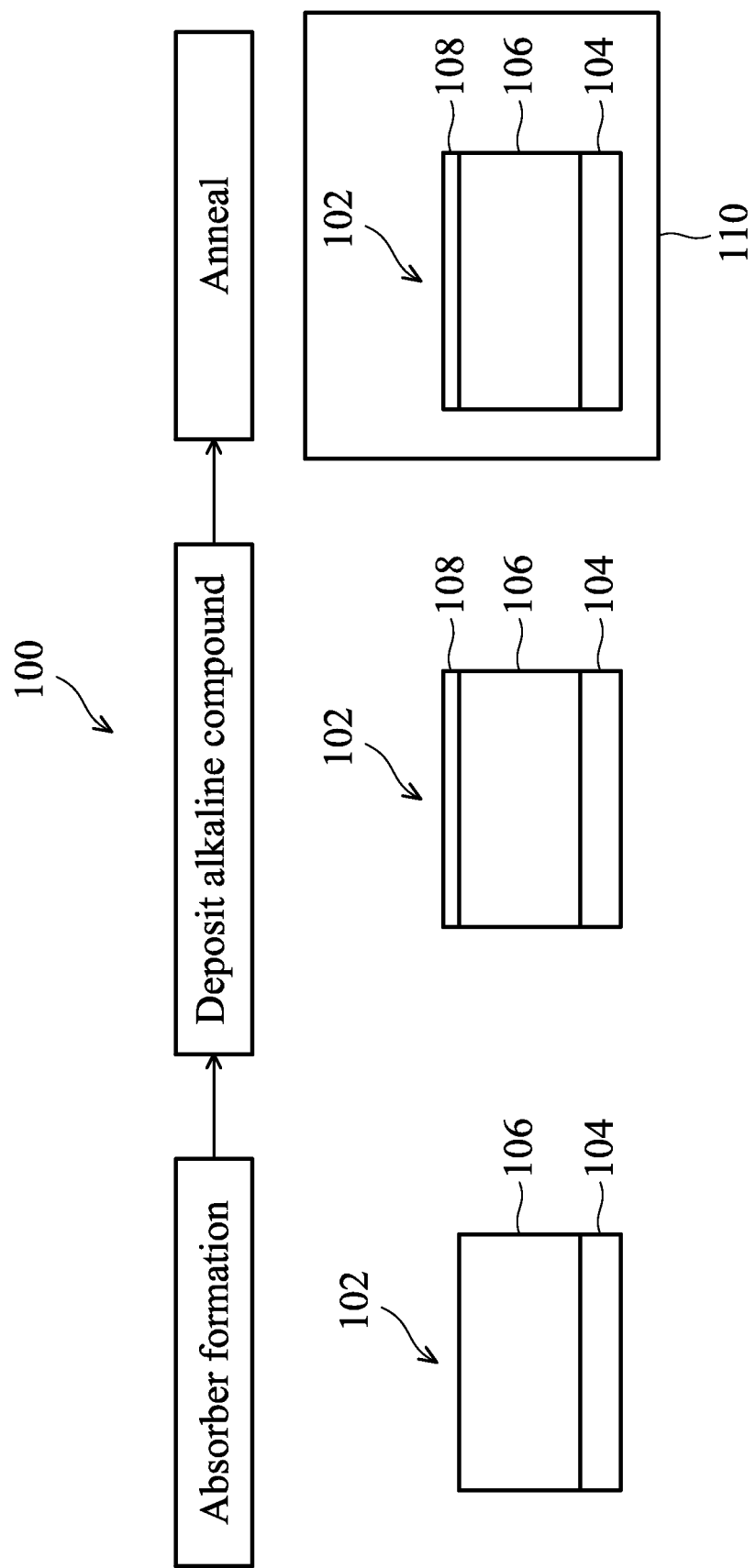
FIG. 1 illustrates one embodiment of an alkaline metal deposition process in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Thin-film photovoltaic devices based on CIGS absorbers show excellent light-to-power conversion efficiencies. For these high performance levels, alkaline metals are incorporated into the CIGS layer. The alkaline metals may be provided by substrate materials. However, inclusion of alkaline metals sufficient for CIGS absorber formation may result in a change in thermal properties of the substrate.

The disclosure generally provides methods and systems for modifying a CIGS absorber surface by depositing an alkaline metal layer thereon. According to some embodiments, an absorber is formed on a molybdenum ("Mo") back electrode. An alkaline metal layer is deposited on an upper surface of the absorber. The absorber is annealed with an annealing gas to drive a reaction between the alkaline metal layer and the absorber, resulting in a copper-poor surface region of the absorber at the interface between the absorber and the alkaline metal layer.

Figure 9:
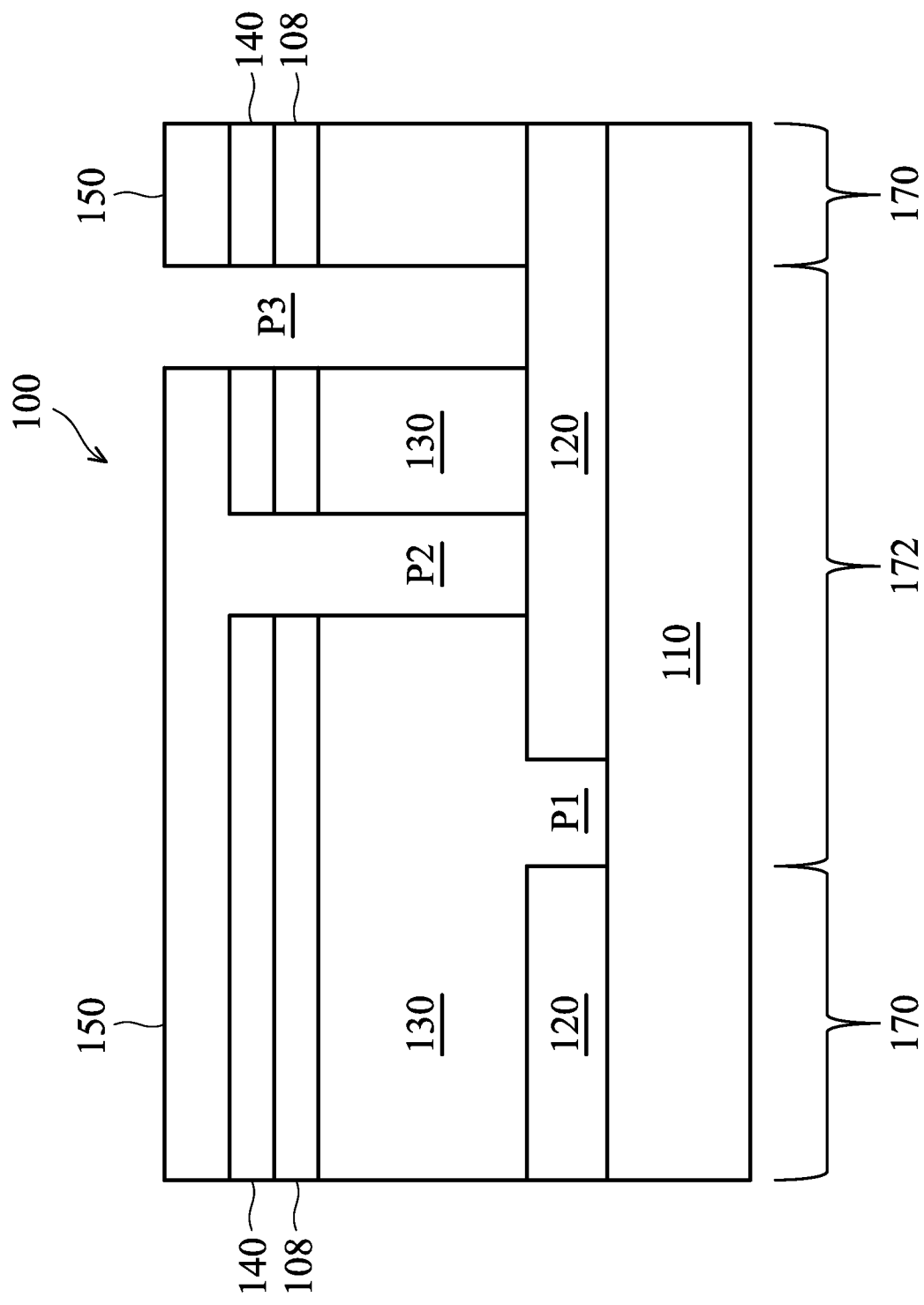
FIG. 9 is a cross-sectional view of a solar cell in accordance with some embodiments.

FIG. 9 is a cross-sectional view of a solar cell according to some embodiments. The portion of the solar panel 100 shown in FIG. 9 includes an interconnect structure 172, which provides a series connection between two adjacent solar cells of the panel 100. In FIG. 9, the width of the interconnect structure 172 is exaggerated relative to the width of the collection region 170 for clarity, but the collection region 170 is actually much wider than the interconnect structure 172.

The solar cell 100 includes a solar cell substrate 110, a back contact layer 120, an absorber layer 130, an alkaline layer 108 a buffer layer 140 and a front contact layer 150.

Substrate 110 can include any suitable substrate material, such as glass. In some embodiments, substrate 110 includes a glass substrate, such as soda lime glass, or a flexible metal foil, or a polymer (e.g., a polyimide, polyethylene terephthalate (PET), polyethylene naphthalene (PEN)). Other embodiments include still other substrate materials.

Back contact layer 120 includes any suitable back contact material, such as metal. In some embodiments, back contact layer 120 can include molybdenum (Mo), platinum (Pt), gold (Au), silver (Ag), nickel (Ni), or copper (Cu). Other embodiments include still other back contact materials. In some embodiments, the back contact layer 120 is from about 50 nm to about 2 µm thick.

In some embodiments, absorber layer 130 includes any suitable absorber material, such as a p-type semiconductor. In some embodiments, the absorber layer 130 can include a chalcopyrite-based material comprising, for example, Cu(In, Ga)Se$_2$ (CIGS), cadmium telluride (CdTe), CuInSe$_2$ (CIS), CuGaSe$_2$ (CGS), Cu(In,Ga)Se$_2$ (CIGS), Cu(In,Ga)(Se,S)$_2$ (CIGSS), CdTe or amorphous silicon. Other embodiments include still other absorber materials. In some embodiments, the absorber layer 140 is from about 0.3 μm to about 8 μm thick.

The buffer layer 140 is deposited on the absorber 130 to form a p/n junction. The buffer layer 140 can include any suitable buffer material, such as n-type semiconductors. In some embodiments, buffer layer 140 can include cadmium sulphide (CdS), zinc sulphide (ZnS), zinc selenide (ZnSe), indium sulfide (In$_2$S$_3$), indium selenide (In$_2$Se$_3$), or Zn$_{1-x}$Mg$_x$O, (e.g., ZnO). Other embodiments include still other buffer materials. In some embodiments, the buffer layer 140 is from about 1 nm to about 500 nm thick.

In some embodiments, front contact layer 150 includes an annealed transparent conductive oxide (TCO) layer of constant thickness of about 100 nm or greater. The terms "front contact" and "TCO layer" are used interchangeably herein; the former term referring to the function of the layer 150, and the latter term referring to its composition. In some embodiments, the charge carrier density of the TCO layer 150 can be from about $1 \times 10^{17}$ cm$^{-3}$ to about $1 \times 10^{18}$ cm$^{-3}$. The TCO material for the annealed TCO layer can include suitable front contact materials, such as metal oxides and metal oxide precursors. In some embodiments, the TCO material can include AZO, GZO, AGZO, BZO or the like) AZO: alumina doped ZnO; GZO: gallium doped ZnO; AGZO: alumina and gallium co-doped ZnO; BZO: boron doped ZnO. In other embodiments, the TCO material can be cadmium oxide (CdO), indium oxide (In$_2$O$_3$), tin dioxide (SnO$_2$), tantalum pentoxide (Ta$_2$O$_5$), gallium indium oxide (GaInO$_3$), (CdSb$_2$O$_3$), or indium oxide (ITO). The TCO material can also be doped with a suitable dopant.

In some embodiments, in the doped TCO layer 150, SnO$_2$ can be doped with antimony, (Sb), fluorine (F), arsenic (As), niobium (Nb) or tantalum (Ta). In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, SnO$_2$ can be doped with antimony (Sb), F, As, niobium (Nb), or tantalum (Ta). In other embodiments, In$_2$O$_3$ can be doped with tin (Sn), Mo, Ta, tungsten (W), Zr, F, Ge, Nb, Hf, or Mg. In other embodiments, CdO can be doped with In or Sn. In other embodiments, GaInO$_3$ can be doped with Sn or Ge. In other embodiments, CdSb$_2$O$_3$ can be doped with Y. In other embodiments, ITO can be doped with Sn. Other embodiments include still other TCO materials and corresponding dopants.

In some embodiments, a plurality of solar cells 100 are arranged adjacent to each other, with the front contact 150 of each solar cell conducting current to the next adjacent solar cell. Each solar cell 100 includes an interconnect structure 172 for conveying charge carriers from the front contact 150 of a solar cell to the back contact 120 of the next adjacent solar cell on the same panel. The layers 120, 130, 140 and 150 are provided in the collection regions 170. The interconnect structure 172 also includes three lines, referred to as P1, P2, and P3. The P1 scribe line extends through the back contact layer 130 and is filled with the absorber layer material. The P2 scribe line extends through the buffer layer 140 and the absorber layer 130, and contacts the back contact 120 of the next adjacent solar cell, thus connecting adjacent solar cells in series. The P3 line extends through the front contact layer 150, buffer layer 140 and absorber layer 130. The P3 line of the adjacent solar cell is immediately to the left of the collection region 170 of the solar cell 100.

The P3 line separates the front contacts 150, buffer layers 140 and absorber layers 130 of adjacent solar cells, so that each front contact can transmit current through the P2 scribe line to the back contact of the next adjacent solar cell without shorting between front adjacent contacts.

FIG. 1 illustrates one embodiment of an alkaline metal deposition process 100. A cell 102 comprises a Mo electrode 104 having an absorber 106 formed thereon, such as, for example, a copper/iridium/gallium/selenium (CIGS) absorber. The absorber 106 may be formed by any suitable process, such as, for example, a co-evaporation process, a two-step process, a solution process, and/or any other suitable process. After forming the absorber 106, an alkaline metal compound 108 is deposited on an upper side of the absorber 106. The alkaline metal compound 108 can be deposited using any suitable method, such as, for example, a sputter process, an evaporation process, a solution process, and/or other suitable processes. Various examples of wet deposition processes suitable for this purpose are discussed in more detail below.

After the alkaline metal compound 108 is deposited on the absorber 106, the cell 102 is annealed in an annealing gas 110. The annealing gas 110 drives an interaction between the absorber 106 and the alkaline metal compound 108, resulting in a reduced copper concentration at the upper surface of the absorber 106. The annealing gas 110 can comprise any suitable annealing gas such as, for example, selenium, sulfur, hydrogen selenide, hydrogen sulfide, and/or any other suitable annealing gas.

Figures 2A, 2B, 2C:
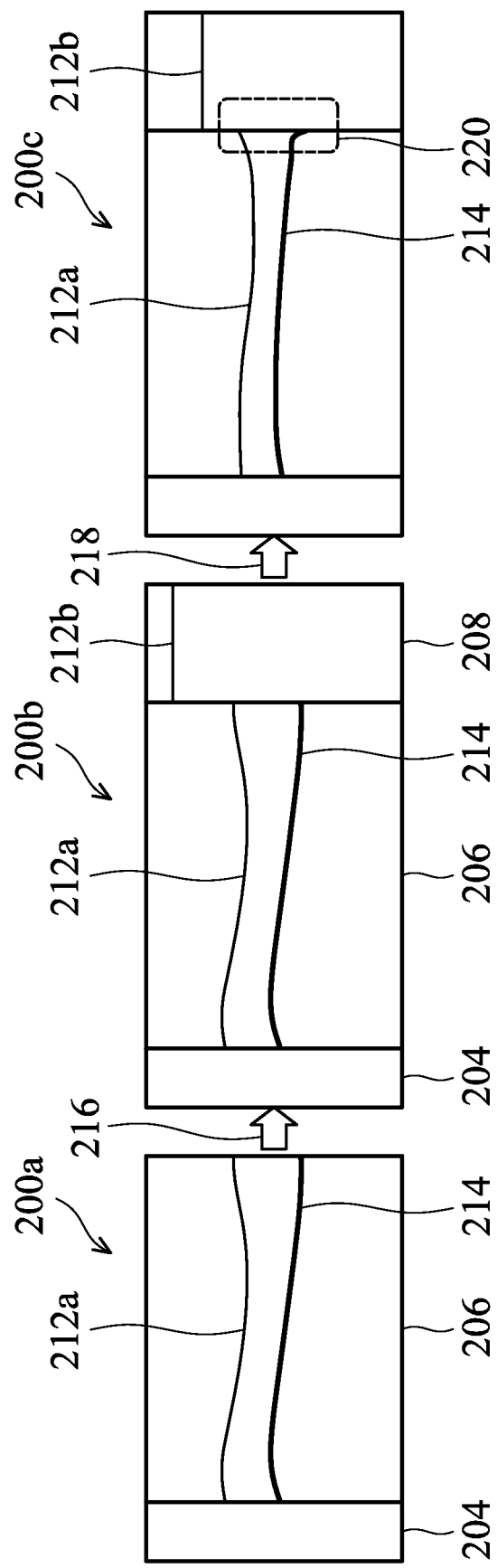
FIG. 2A illustrates a material profile of a cell having a back (e.g., Mo) electrode and an absorber formed thereon in accordance with some embodiments
FIG. 2B illustrates the material profile of the cell of FIG. 2A having an alkaline metal layer deposited thereon in accordance with some embodiments.
FIG. 2C shows the alkaline metal concentration of the absorber layer and alkaline metal layer of the cell of FIG. 2B after an annealing process in accordance with some embodiments.

FIG. 2A illustrates a material profile of a cell 202 having a back (e.g., Mo) electrode 204 and an absorber 206 formed thereon. In FIG. 2A, the vertical axis shows the concentration of the alkaline metal in the absorber layer at various depths in the absorber. The absorber 206 comprises an alkaline profile (e.g., a potassium (K) profile 212a if the alkaline metal layer is potassium) and a copper (Cu) profile 214.

In FIG. 2B, an alkaline metal layer 208 is deposited 216 on the absorber 206. The alkaline metal layer 208 comprises an alkaline metal profile 212b (such as a potassium profile in the case of a potassium alkaline layer). The potassium profile 212b indicates that the concentration of the alkaline metal layer 208 in the alkaline material layer 208 is higher than the potassium concentration throughout the absorber 206.

FIG. 2C shows the alkaline metal concentration of the absorber layer 206 and alkaline metal layer 208 after an annealing process 218. The annealing process causes the alkaline metal layer 208 to interact with a surface of the absorber 206, altering the material copper concentration 214 of the absorber 206 at the interface 220 between the absorber 206 and the alkaline metal layer 208. The alkaline metal atoms replace copper atoms in many sites. The annealing process 218 generates a copper-poor, potassium-rich surface 220.

Figure 3:
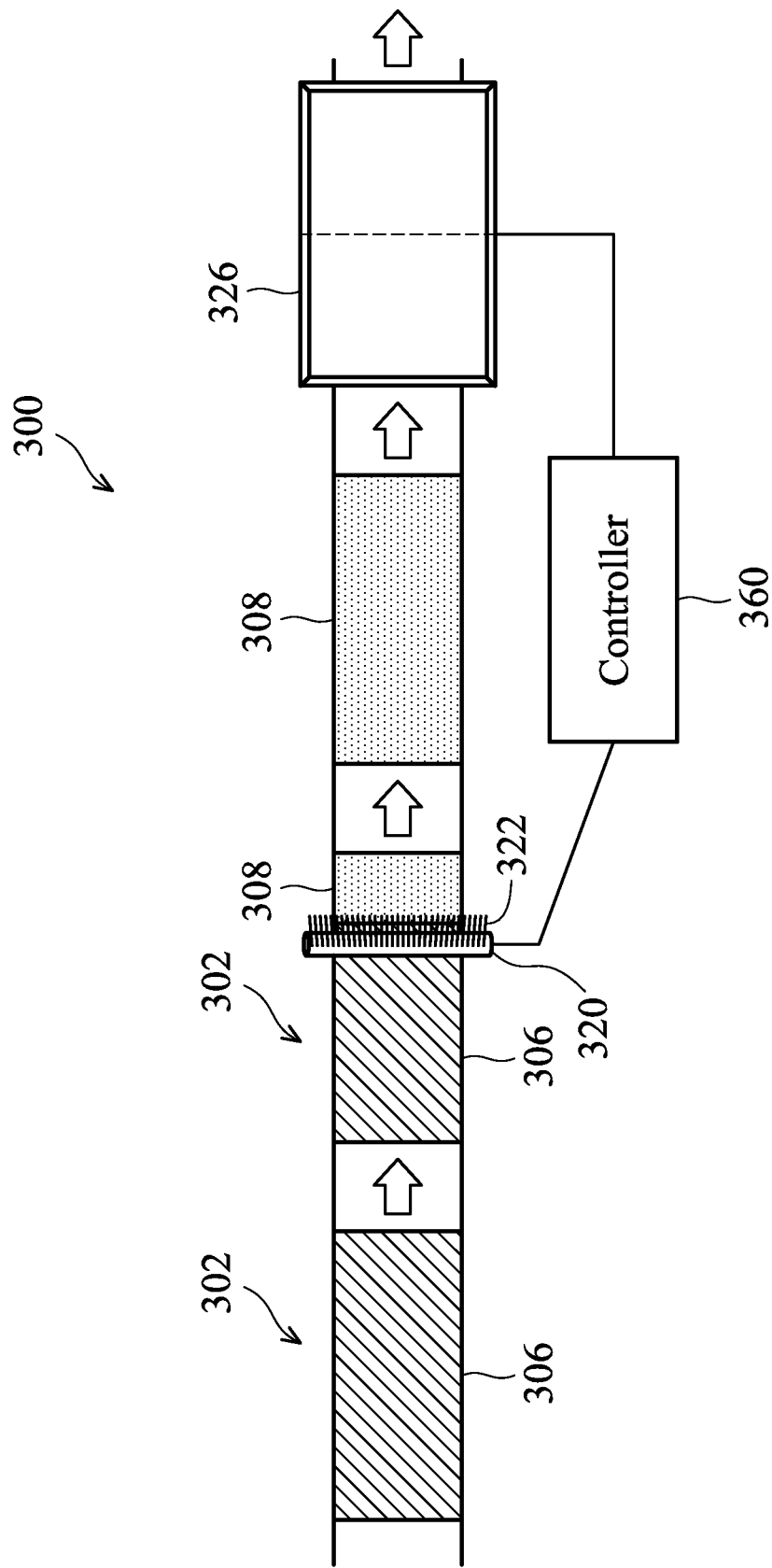
FIG. 3 illustrates a spray system for depositing an alkaline metal solution in accordance with some embodiments.

In some embodiments, the alkaline metal compound 108 is deposited using a wet process. FIG. 3 illustrates one embodiment of a wet spray system 300 for depositing an alkaline metal layer 308 on an absorber 306. As shown in FIG. 3, a cell 302 having an absorber 306 formed on a Mo electrode (not shown) is transported below a spray arm 320 configured to spray an alkaline metal solution 322 onto the absorber 306. The cell 302 can be moved by, for example, a conveyor belt 324 and/or any other suitable transportation system.

The alkaline metal solution 322 can comprise any suitable alkaline metal, such as, for example, a sodium (Na) or potassium (K) based alkaline metal. Examples of suitable alkaline metals for this purpose include, but are not limited to, NaF, NaCl, NaBr, KF, KCl, and/or KBr. The alkaline metal solution 322 is formed by mixing the alkaline metal with a solvent, such as, for example, deionized (DI) water, ethanol, isopropanol, and/or any other suitable solvent. The alkaline metal solution 322 can comprise a concentration in a range from 0.01M to 0.05M of the alkaline metal. Other suitable concentrations of alkaline metal can be used. The alkaline metal solution 322 can be deposited at any suitable temperature, such as, for example, in a range from about 25° C. to about 75° C. The alkaline metal layer 308 can be deposited to any suitable thickness, such as, for example, a thickness of about 10 nm to about 1 mm. Deposition temperature and thickness may be affected by, for example, one or more absorber surface properties such as wetting behavior.

The alkaline metal compound 322 can be deposited in a chamber having a heating system (not shown). The heating system is configured to heat the cell 302 to dry the alkaline metal layer 308 prior to the cell 302 being transported into an annealing system 326. The heating system can heat the cell 302 to any suitable temperature to dry the alkaline metal layer 308. For example, in some embodiments, the heating system can heat the cell 302 to a temperature of about 50° C. to about 100° C., such as, for example, 75° C. Temperatures of about 50° C. comprise, for example, temperatures above or below 50° C., such as 49° C. or 52° C. Temperatures of about 100° C. comprise, for example, temperatures above or below 100° C., such as 99° C. or 102° C. The annealing system 326 is configured to anneal the cell 302 in an annealing gas to drive an interaction between the alkaline metal layer 308 and the absorber 306 to produce a copper-poor region 220 at the interface between the absorber 306 and the alkaline metal layer 308. After annealing, the cell 302 is transported for additional processing, such as, for example, formation of a buffer layer thereon.

A controller 360 is configured to control the operation of one or more elements of the wet spray system 300. For example, in some embodiments, the controller 360 is configured to control at least one of the conveyor belt 324, the spray arm 320, the heating system, and/or the annealing system 326. The controller 360 may be configured to initiate the annealing process a predetermined time period after the alkaline metal solution 322 is deposited. For example, in some embodiments, the predetermined time period corresponds to, for example, a time period sufficient for the alkaline metal layer 308 to dry. In other embodiments, activation of the annealing process corresponds to a location of the cell 302 and/or one or more additional parameters.

Figure 4:
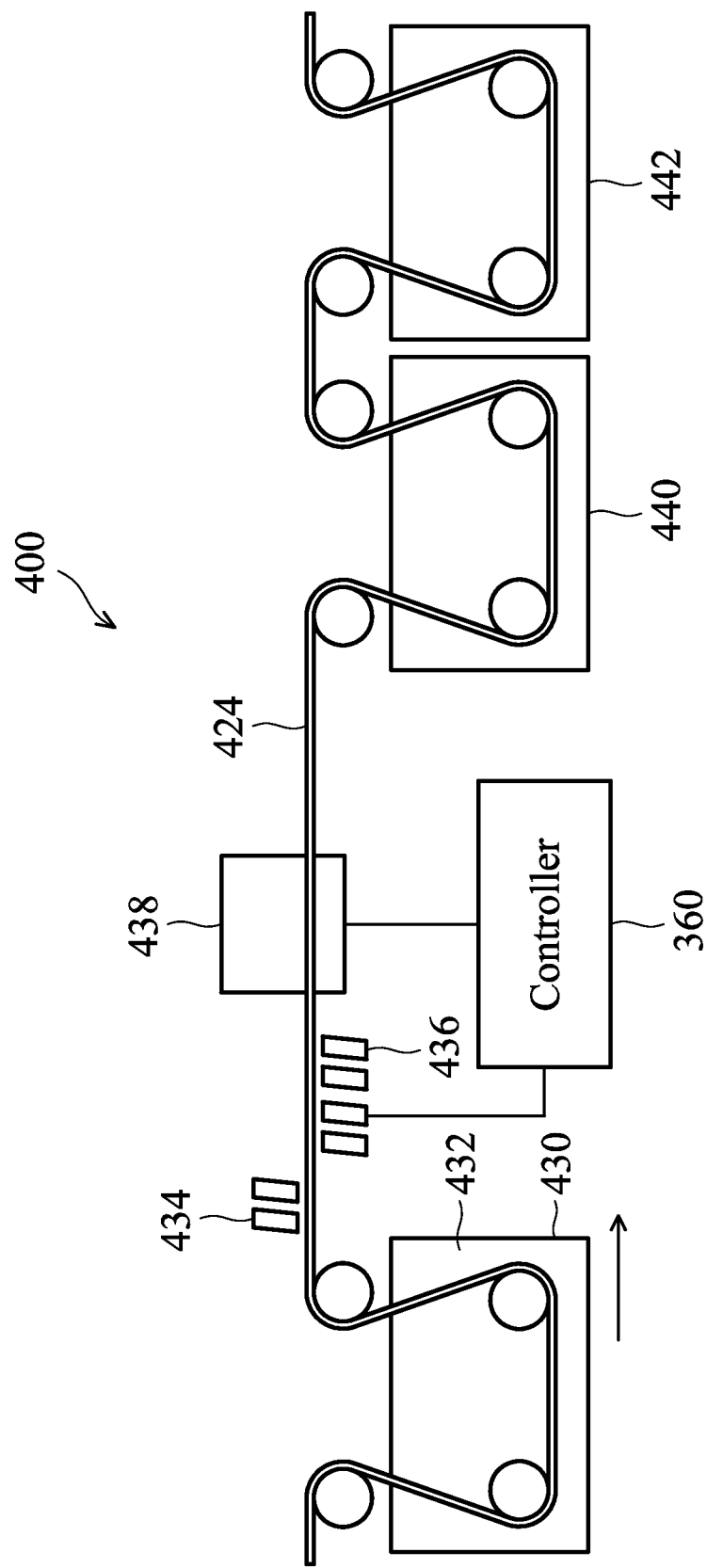
FIG. 4 illustrates a dip system for depositing an alkaline metal solution in accordance with some embodiments.

FIG. 4 illustrates one embodiment of a wet dip system 400 for depositing an alkaline metal layer 108 on a CIGS absorber 106. A cell 102 having an absorber 106 formed on a back (e.g., Mo) electrode 104 is transported into a tank 430 having an alkaline metal solution 432 therein. The cell 102 is immersed in the alkaline metal solution 432 to form an alkaline metal layer 108 thereon. After immersion, the cell 102 is removed from the tank 430 and passes through a blow dryer 434 and a heating system 436 to dry the alkaline metal layer 108. For example, in some embodiments, the heating system can heat the cell 102 to a temperature of about 50° C. to about 100° C., such as, for example, 75° C. The blow dryer 434 can provide a Nitrogen ($N_2$) air flow. The dried cell 102 is passed into an anneal system 438 to apply an annealing process to the cell 102. The annealing process drives the alkaline metal layer 108 and the absorber 106 to interact, producing a copper-poor region at the interface between the absorber 106 and the alkaline metal layer 108. In some embodiments, the copper concentration is reduced to zero within about 300 nm of the surface. Effective reduction of the copper layer results in increased electrical performance of the CIGS absorber 106.

The alkaline metal solution 432 can comprise any suitable alkaline metal which is capable of being substituted into copper sites at the interface between the absorber layer and the alkaline metal layer, such as, for example, a sodium (Na) or potassium (K) based alkaline metal. Example alkaline metals include, but are not limited to, NaF, NaCl, NaBr, KF, KCl, and/or KBr. The alkaline metal solution 432 is formed by mixing the alkaline metal with a solvent, such as, for example, deionized (DI) water, distilled water, ethanol, isopropanol, and/or any other suitable solvent. The alkaline metal solution 432 can comprise a concentration of, for example, from about 0.01M to about 0.1M. Those skilled in the art will recognize that any suitable concentration of alkaline metal can be used. A suitable concentration may be configured to produce a uniform alkaline layer without clear precipitate. Suitable concentrations may be affected by one or more absorber surface properties, such as, for example, wetting behavior. In some embodiments, lower concentrations induce non-uniformity of coverage while higher concentrations form thicker alkaline layers but may result in some precipitation. Alkaline precipitation may result in absorption of water and reduction of surface quality. The alkaline metal solution 432 can be deposited at any suitable temperature, such as, for example, about 25° C. to about 75° C. The alkaline metal layer 108 can be deposited to any suitable thickness, such as, for example, a thickness of about 10 nm to about 1 mm. The alkaline metal layer 108 may be removed after formation of the copper-poor surface on the CIGS absorber 106. The alkaline metal layer 108 may be removed during and/or after the annealing process.

After the cell 102 is annealed, additional processing can be performed. For example, as shown in FIG. 4, the annealed cell 102 can be transported to a chemical bath deposition (CBD) tank 440. The cell 102 is immersed in a chemical bath within the CBD tank 440 to form a buffer layer on the cell 102. The cell 102 is transported to a washing tank 442 after the CBD tank 440. The cell 102 can undergo additional processing.

A controller 360 is configured to control the operation of one or more elements of the wet dip system 400. For example, in some embodiments, the controller 360 is configured to control at least one of a conveyor belt, the heating system 436, and/or the annealing system 438. The controller 360 may be configured to initiate the annealing process a predetermined time period after the alkaline metal solution 432 is deposited. For example, in some embodiments, the predetermined time period corresponds to, for example, a time period sufficient for the alkaline metal layer 108 to dry. In other embodiments, activation of the annealing process corresponds to a location of the cell 102 and/or one or more additional parameters.

An absorber 106, 306 having an alkaline metal layer applied as described herein, provides an increased efficiency over an otherwise similar absorber without the alkaline metal layer. For example, in one embodiment, a potassium dip treatment (PDT) utilizing a KCl solution provides increased efficiency of about 0.7% over a baseline (BSL) absorber. The KCl solution was a deposited to a thickness of about 200 nm. Table 1 illustrates a comparison between the PDT treated absorber and the baseline (BSL) absorber.

TABLE 1

| Circuit | PDT | BSL |
|---|---|---|
| Efficiency (%) | 16.72 | 15.98 |
| Jsc (mA/cm2) | 35.55 | 35.38 |
| Voc (mV) | 677 | 657 |
| FF | 0.69 | 0.69 |
| Rs (Ω cm2) | 2.81 | 2.27 |
| Rsh (Ω cm2) | 792 | 368 |

The anneal systems 326, 438 are configured for an annealing process to drive interaction between an absorber 106 and an alkaline metal layer 108. In various embodiments, an annealing gas can be selected based on chemical composition of the absorber. For example, in some embodiments, the absorber 106 can comprise a CIGS ($Cu(In_{1-x}Ga_x)Se_2$) absorber. In these embodiments, the annealing gas can comprise any of a selenium (Se) vapor, a sulfur (S) vapor, a $H_2Se$ gas, and/or a $H_2S$ gas. In other embodiments, the absorber 106 can comprise a CIGSS ($Cu(In_{1-x}Ga_x)Se_{2-y}S_y$) absorber. In this embodiments, the annealing gas can comprise a sulfur (S) vapor, an $H_2S$ gas, or combinations thereof. Sulfur will replace the Se site during an annealing procedure, resulting in an increased surface band-gap and further increase in the open circuit voltage (Voc). In contrast to the CIGS absorber, if the absorber is a CIGSS absorber, additional Se would replace some of the sulfur and decrease the Voc and performance of the absorber, and therefore annealing gas should be limited to Se based gases for CIGSS absorbers.

In some embodiments, the annealing process comprises a rapid thermal processing (RTP) step. A cell 102 having an alkaline metal layer 108 formed on an absorber 106 is placed inside of an annealing chamber. The annealing chamber is filled with an annealing gas at a starting temperature, such as, for example, >200° C. The annealing gas fills the chamber to a pressure of around 500-650 torr. In some embodiments, the annealing gas is heated to an annealing temperature at a ramp rate, such as, for example, 350° C.-450° C. with a ramp up of about 7° C.-20° C. per minute. The annealing gas is maintained at the annealing temperature for a predetermined time period. After the annealing period, the cell 102 and the annealing gas are allowed to cool to below a predetermined temperature, such as, for example, 200° C. The annealing gas is purged from the chamber and the cell 102 is transported for additional processing.

Figures 5, 6:
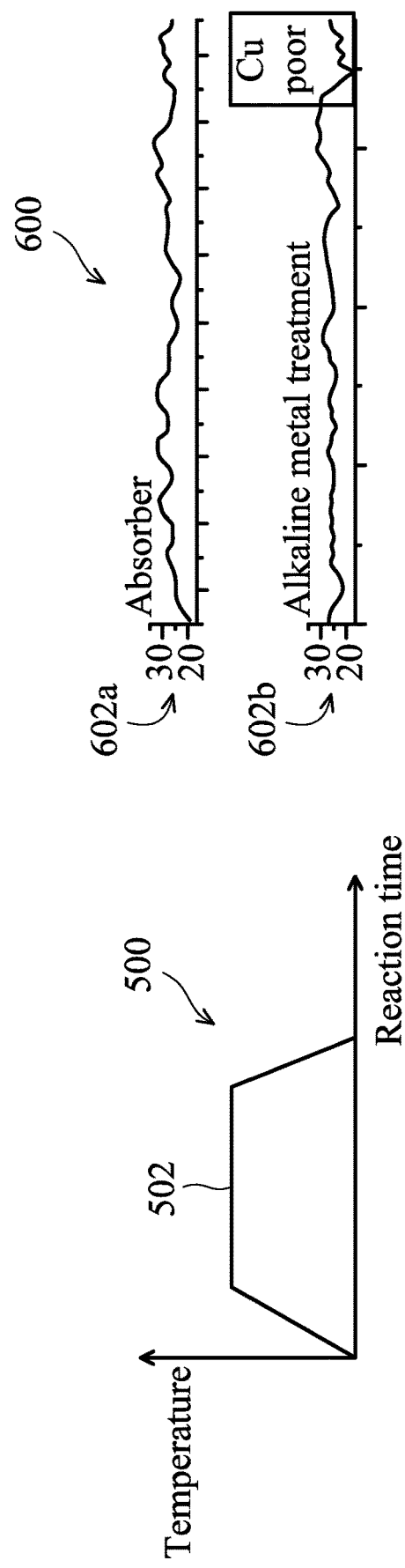
FIG. 5 is a chart illustrating a temperature profile for an anneal process in accordance with some embodiments.
FIG. 6 is a comparison of chemical compositions of CIGS absorbers in accordance with some embodiments.

FIG. 5 is chart 500 illustrating one embodiment of a temperature response curve 502 for an annealing process of a cell, such as, for example, cell 102. An annealing gas is introduced into an annealing chamber at a temperature >200° C. The temperature is ramped at a rate of about 7° C.-20° C. per minute until the predetermined temperature is reached, such as, for example, a temperature of about 350° C.-450° C. The temperature is maintained for a predetermined time period, such as, for example about 20-40 minutes. After annealing, the cell 102 is allowed to cool before being transported for additional processing.

FIG. 6 is a comparison of chemical compositions 602a, 602b of an absorber illustrating the copper atom percentage in the absorbers over the thickness of the absorber. The chemical composition 602a corresponds to untreated absorbers, which have copper-rich portions located close to the surface of the absorber. For a two-step CIGS fabrication process (i.e., CIG, followed by S), copper will tend to pile up at the surface of the absorber during the formation process. The chemical composition 602b corresponds to an absorber having an alkaline metal treatment applied as discussed herein. The chemical composition 602b comprises a copper-poor region located adjacent to the surface of the absorber. After the absorber is treated with the alkaline metal treatment, the copper content at the surface is reduced.

Figure 7A:
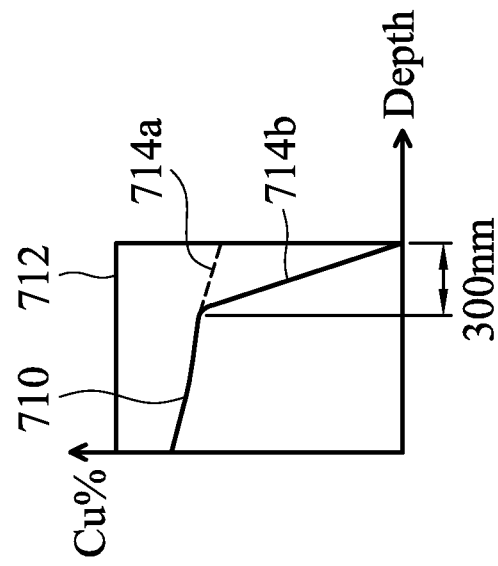
FIG. 7A illustrates the interface region between a CIGS absorber and a deposited alkaline of the solar cell of FIG. 7, in accordance with some embodiments.
Figure 7:
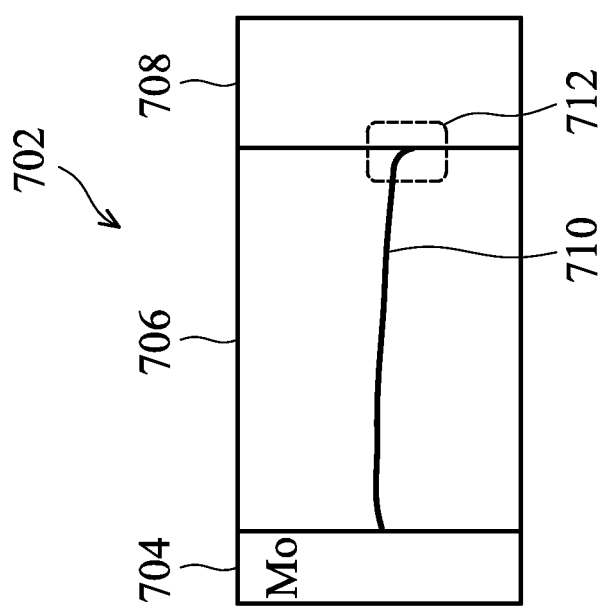
FIG. 7 illustrates a solar cell having an alkaline metal deposited thereon in accordance with some embodiments.

FIG. 7 illustrates a cell 702 comprising an absorber 706 formed on a Mo electrode 704 and having a copper profile 710. An alkaline metal layer 708 is formed on the absorber 706. The cell 702 is annealed, causing the alkaline metal layer 708 to interact with the absorber 706. The interaction reduces the copper profile 710 of the absorber 706 near a boundary 712 with the alkaline metal layer 708. FIG. 7A is an enlarged detail of the boundary region 712. The dotted line 714a illustrates a copper profile of an untreated boundary region 712. After the alkaline treatment, the boundary region 712 has a copper profile 714b corresponding to a copper-poor region. For example, in the illustrated embodiment, the boundary region 712 comprises at least a −5% copper-depletion range within 300 nm of the surface.

Figure 8:
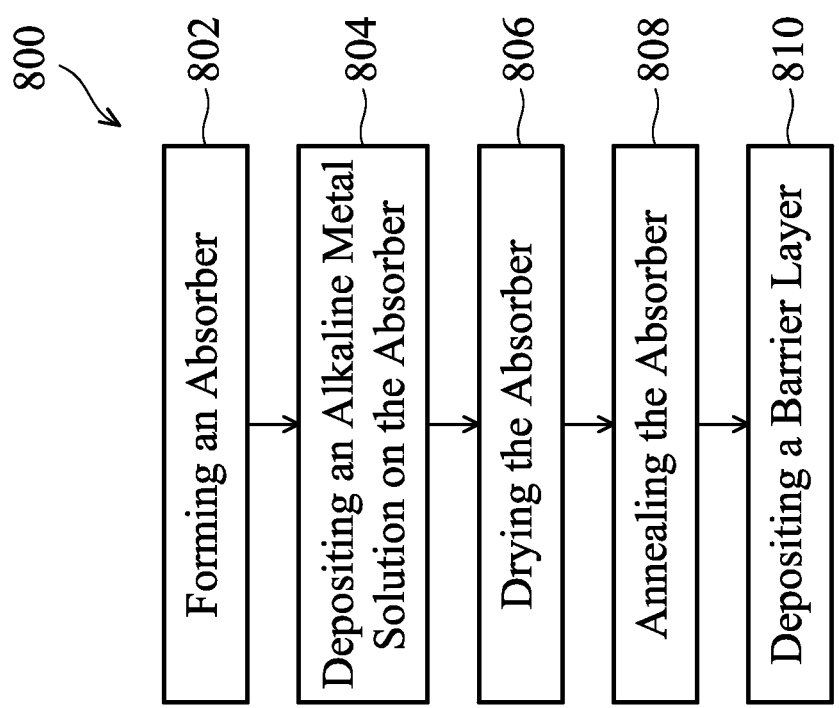
FIG. 8 illustrates a method for reducing a copper-concentration of a surface of an absorber in accordance with some embodiments.

FIG. 8 illustrates a method 800 of reducing the copper-concentration of at a surface of an absorber. In a first step 802, an absorber is formed on a back (e.g., Mo) electrode. The absorber can be formed by any suitable process, such as, for example, co-evaporation, a two-step process, a solution process, and/or any other suitable process. The absorber can comprise, for example, a CIGS absorber. In a second step 804, an alkaline metal layer is deposited onto the absorber. The alkaline metal layer can be deposited by any suitable method, such as, for example, a wet method. Wet methods include, for example, a spray method and/or a dip method. The alkaline metal layer can be deposited as an alkaline solution comprising a predetermined concentration of one or more alkaline metals, such as, for example, a 0.01M-0.05M solution of NaF, NaCl, NaBr, KF, KCl, or KBr.

In a third step 806, the alkaline metal layer is dried. The alkaline metal layer can be dried by any suitable process, such as, for example, a heater heating the absorber to a predetermined temperature, such as, for example, between about 50° C.-100° C. A blow drying process can also be used to dry the alkaline metal layer.

In a fourth step 808, the absorber is annealed in an annealing gas to drive a reaction between the alkaline metal layer and the absorber. The annealing gas can be selected based on the chemical composition of the absorber layer. For example, for a CIGS absorber, the annealing gas can comprise a sulfur-based or selenium-based gas. As another example, for a CIGSS absorber, the annealing gas can comprise a sulfur-based gas.

After the absorber is annealed, a buffer layer can be applied in a fifth step 810.

The present disclosure provides systems and methods for depositing an alkaline metal layer on an absorber to generate a copper-poor region at a surface of the absorber. The copper-poor region provides an increased efficiency over non-treated absorbers having copper-rich surfaces. The alkaline metal layer can be deposited by any suitable deposition method, such as, for example, a wet deposition method. After the alkaline metal layer is deposited, the absorber is annealed, causing the alkaline metal layer to interact with the absorber to reduce the copper-concentration of the absorber at the interface between the alkaline metal layer and the absorber.

In various embodiments, a method for forming a photovoltaic cell is disclosed. The method comprises the steps of forming an absorber on a back electrode, depositing a material comprising an alkaline metal on a surface of the absorber, and annealing the absorber to reduce a copper content of the absorber at the surface.

In various embodiments, a system for forming a photovoltaic cell is disclosed. The system comprises a sprayer configured to deposit an alkaline metal solution onto a surface of an absorber and an anneal chamber configured to anneal the absorber and the alkaline metal solution. A controller is configured to control the sprayer and the annealing chamber, wherein the controller is configured to activate the annealing chamber a predetermined period after the alkaline metal solution is deposited.

In various embodiments, a system for forming a photovoltaic cell is disclosed. The system comprises a dip tank having an alkaline metal solution therein and anneal chamber. The dip tank is configured to receive an absorber therein. An alkaline metal layer is deposited on the absorber by the dip tank. The anneal chamber is configured to anneal the absorber and the alkaline metal layer. A controller is configured to control the sprayer and the annealing chamber, wherein the controller is configured to activate the annealing chamber a predetermined period after the alkaline metal solution is deposited The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a photovoltaic cell, comprising:
   forming an absorber on a back electrode;
   forming an alkaline metal layer on the absorber by depositing a solution comprising a concentration of an alkaline metal in a range from 0.01 M to 0.05 M on a surface of the absorber;
   reducing the copper content of the absorber at the surface, wherein the surface includes at least a −5% copper depletion range, wherein the copper content is reduced by annealing the absorber and the alkaline metal layer in an annealing chamber, wherein the annealing chamber is filled with an annealing gas at a starting temperature greater than 200° C. at a pressure of 500-650 torr, and wherein the annealing gas is heated at a temperature ramp rate of 7° C.-20° C. per minute to a temperature of 350° C.-450° C., and wherein the annealing occurs a predetermined time period after forming the alkaline metal layer on the absorber; and
   removing the alkaline metal layer after annealing the absorber.

2. The method of claim 1, wherein the solution is deposited by a spray process.

3. The method of claim 1, wherein the solution is deposited by a dip process.

4. The method of claim 1, wherein the solution comprises one of a potassium-based solution or a sodium-based solution.

5. The method of claim 4, wherein the solution comprises a predetermined concentration of at least one of NaF, NaCl, NaBr, KF, KCl, or KBr.

6. The method of claim 1, further comprising drying the absorber after depositing the solution.

7. The method of claim 6, wherein drying the absorber comprises the step of heating the absorber to a temperature from about 50° C. to about 100° C.

8. The method of claim 1, wherein annealing the absorber comprises the step of exposing the absorber to an annealing gas.

9. The method of claim 8, wherein the annealing gas comprises one of a sulfur vapor, a selenium vapor, H2S gas, or H2Se gas.

10. A system, comprising:
    an alkaline metal solution having a concentration of an alkaline metal in a range from 0.01 M to 0.05M;
    a sprayer configured to form an alkaline metal layer by depositing the alkaline metal solution onto a surface of an absorber;
    an annealing chamber configured to anneal the absorber the alkaline metal layer, wherein the annealing chamber is filled with an annealing gas at a starting temperature greater than 200° C. at a pressure between 500-650 torr, wherein the annealing chamber is configured to heat the annealing gas a temperature ramp rate of 7° C.-20° C. per minute to a temperature of 350° C.-450° C., wherein the annealing chamber is configured to generate a boundary between the absorber and the alkaline metal layer having at least a −5% copper depletion range; and
    a controller circuit configured to control the sprayer and the annealing chamber, wherein the controller is configured to activate the annealing chamber a predetermined period after the alkaline metal solution is deposited.

11. The system of claim 10, further comprising a heater configured to dry the absorber after the alkaline metal solution is deposited.

12. The system of claim 11, wherein the heater is configured to heat the absorber to a temperature between 50° C. and 100° C.

13. The system of claim 10, wherein the alkaline metal solution comprises one of a potassium-based solution or a sodium-based solution.

14. The system of claim 13, wherein the alkaline metal solution comprises at least one of NaF, NaCl, NaBr, KF, KCl, or KBr.

* * * * *